(12) United States Patent
Makiyama

(10) Patent No.: US 9,514,930 B2
(45) Date of Patent: Dec. 6, 2016

(54) METHOD FOR MANUFACTURING SEMICONDUCTOR HEMT DEVICE WITH STOICHIOMETRIC SILICON NITRIDE LAYER

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/926,711

(22) Filed: Oct. 29, 2015

(65) Prior Publication Data

US 2016/0049290 A1 Feb. 18, 2016

Related U.S. Application Data

(62) Division of application No. 14/095,038, filed on Dec. 3, 2013, now Pat. No. 9,224,668.

(30) Foreign Application Priority Data

Jan. 17, 2013 (JP) .................................. 2013-006459

(51) Int. Cl.
*H01L 21/02* (2006.01)
*H01L 23/29* (2006.01)
(Continued)

(52) U.S. Cl.
CPC ....... *H01L 21/0217* (2013.01); *H01L 21/0254* (2013.01); *H01L 21/02373* (2013.01); *H01L 23/291* (2013.01); *H01L 23/3171* (2013.01); *H01L 29/42316* (2013.01); *H01L 29/42364* (2013.01); *H01L 29/66462* (2013.01); *H01L 29/7787* (2013.01); *H01L 23/3192* (2013.01); (Continued)

(58) Field of Classification Search
None
See application file for complete search history.

(56) References Cited

U.S. PATENT DOCUMENTS 7,948,062 B2  5/2011 Makiyama et al.
8,258,544 B2  9/2012 Nagahisa et al.
(Continued)

FOREIGN PATENT DOCUMENTS

JP  2009-164300 A  7/2009
JP  2010-232452 A  10/2010
(Continued)

OTHER PUBLICATIONS

Office action of corresponding Chinese Patent Application No. 201310698719.2 dated Mar. 4, 2016 with English Translation.
(Continued)

*Primary Examiner* — Bilkis Jahan
(74) *Attorney, Agent, or Firm* — Kratz, Quintos & Hanson, LLP

(57) ABSTRACT

A semiconductor device includes: a compound semiconductor stack structure including a plurality of compound semiconductor layers stacked over a semiconductor substrate; and a first insulating film covering the surface of the compound semiconductor stack structure, the first insulating film being a silicon nitride film including, on the top side, a first region containing nitrogen element in excess of the stoichiometric ratio.

3 Claims, 16 Drawing Sheets

(51) Int. Cl.
  *H01L 23/31*   (2006.01)
  *H01L 29/423*  (2006.01)
  *H01L 29/66*   (2006.01)
  *H01L 29/778*  (2006.01)
  *H01L 29/20*   (2006.01)
(52) U.S. Cl.
  CPC .... *H01L 29/2003* (2013.01); *H01L 2924/0002* (2013.01)

(56) References Cited

U.S. PATENT DOCUMENTS

| | | | |
|---|---|---|---|
| 2003/0132501 A1* | 7/2003 | Gill | G11C 13/0004 257/505 |
| 2008/0035934 A1* | 2/2008 | Sheppard | H01L 21/045 257/76 |
| 2008/0157121 A1 | 7/2008 | Ohki | |
| 2009/0166815 A1* | 7/2009 | Makiyama | H01L 21/28264 257/640 |
| 2010/0025730 A1 | 2/2010 | Heikman et al. | |
| 2010/0308373 A1 | 12/2010 | Nagahisa et al. | |
| 2012/0146728 A1 | 6/2012 | Makiyama et al. | |

FOREIGN PATENT DOCUMENTS

| | | |
|---|---|---|
| JP | 2010-287605 A1 | 12/2010 |
| JP | 2012-124436 A | 6/2012 |

OTHER PUBLICATIONS

Office Action of corresponding Japanese Application No. 2013-006459 dated Aug. 9, 2016 with partial translation.

\* cited by examiner

METHOD FOR MANUFACTURING SEMICONDUCTOR HEMT DEVICE WITH STOICHIOMETRIC SILICON NITRIDE LAYER

CROSS-REFERENCE TO RELATED APPLICATION

This application is a divisional of U.S. application Ser. No. 14/095,038, filed Dec. 3, 2013, which is based upon and claims the benefit of priority of the prior Japanese Patent Application No. 2013-006459, filed on Jan. 17, 2013, the entire contents of which are incorporated herein by reference.

FIELD

The embodiments discussed herein are related to semiconductor devices, methods for manufacturing the same, power supply devices, and high-frequency amplifiers.

BACKGROUND

High electron mobility transistors (HEMT) having GaN (GaN-HEMT) are an example of semiconductor devices with a compound semiconductor stack structure including compound semiconductors such as nitride semiconductors. For example, high-output devices having GaN-HEMT may be used in power supply devices, and high-frequency devices having GaN-HEMT may be used in high-frequency amplifiers.

High-voltage operation of these devices results in the occurrence of current collapse, which is a phenomenon in which the on resistance is increased to lower drain current (source-drain current). The occurrence of this current collapse decreases output characteristics of the devices such as output and efficiency.

A technique to reduce current collapse is to provide an insulating film covering the surface of a compound semiconductor stack structure.

However, it has been found that when an insulating film is provided to cover the surface of a compound semiconductor stack structure as taught by the above technique, electrons are captured by traps present on the surface of the insulating film during high-voltage operation, thus causing a decrease in drain current.

That is, it has been found that the application of a high drain voltage to the above device in order to enhance output characteristics of the device produces a strong electric field which is applied to the vicinity of the gate electrode, and some of the electrons running through the channel are accelerated by this strong electric field and transit to the surface of the compound semiconductor stack structure, with the result that some of the electrons that have transited are captured by traps present on the surface of the insulating film covering the surface of the compound semiconductor stack structure, thus causing a decrease in drain current.

Thus, it has been found that while the formation of an insulating film covering the surface of a compound semiconductor stack structure as taught by the above technique may reduce current collapse compared to when there is no such an insulating film, sufficient reduction of current collapse is infeasible because traps present on the surface of the insulating film capture electrons and this causes a decrease in drain current.

The following is reference document:
[Document 1] Japanese Laid-open Patent Publication No. 2010-287605.

SUMMARY

According to an aspect of the invention, a semiconductor device includes: a compound semiconductor stack structure including a plurality of compound semiconductor layers stacked over a semiconductor substrate; and a first insulating film covering the surface of the compound semiconductor stack structure, the first insulating film being a silicon nitride film including, on the top side, a first region containing nitrogen element in excess of the stoichiometric ratio.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, semiconductor devices, methods for manufacturing the same, power supply devices, and high-frequency amplifiers according to embodiments will be described with reference to the drawings.

First Embodiment

First, semiconductor devices and methods for manufacturing the same according to the first embodiment will be described with reference to FIGS. 1 to 4B.

A semiconductor device in the present embodiment is a compound semiconductor device having compound semiconductors such as nitride semiconductors. Here, a Schottky field effect transistor (FET) having nitride semiconductors, in detail, a Schottky GaN-HEMT will be described as an example which is used in devices such as high-output devices and high-frequency devices and has a nitride semiconductor stack structure (a HEMT structure) with GaN as an electron transfer layer and AlGaN as an electron supply layer.

Figure 1:
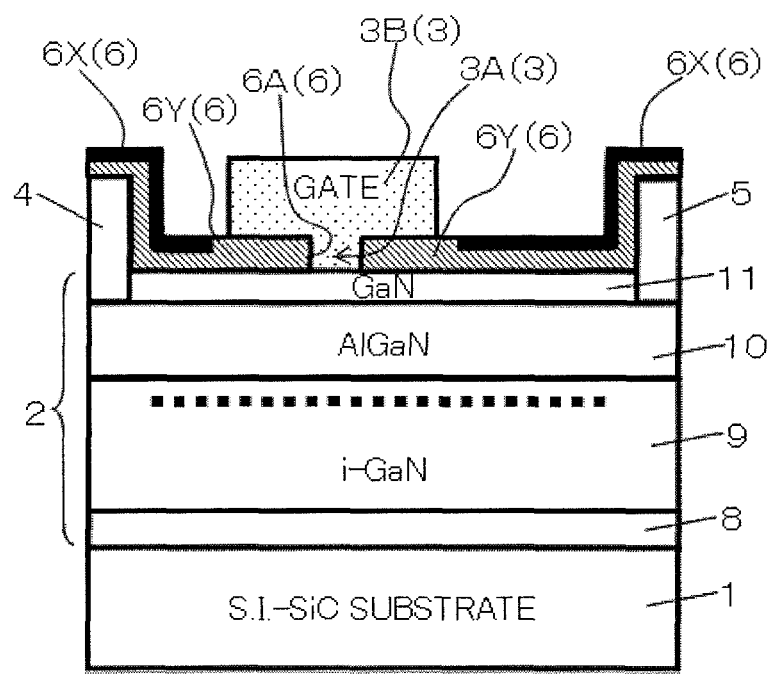
FIG. 1 is a schematic sectional view illustrating a configuration of a semiconductor device according to a first embodiment.

The semiconductor device includes, as illustrated in, for example, FIG. 1, a compound semiconductor stack structure 2 including a plurality of compound semiconductor layers stacked on a semiconductor substrate 1, a gate electrode 3 in Schottky contact with the compound semiconductor stack structure 2, a pair of ohmic electrodes 4 and 5 in ohmic contact with the compound semiconductor stack structure 2, and a first insulating film 6 covering the surface of the compound semiconductor stack structure 2.

Here, the compound semiconductor stack structure 2 is a nitride semiconductor stack structure in which a buffer layer 8, a GaN electron transfer layer 9, an AlGaN electron supply layer 10 and a GaN surface layer (a cap layer) 11 are sequentially stacked on the semi-insulating SiC substrate 1. In this case, as indicated with a dotted line in FIG. 1, a two-dimensional electron gas (2DEG) is formed in the vicinity of the interface between the GaN electron transfer layer 9 and the AlGaN electron supply layer 10. Further, the gate electrode 3 is disposed on the GaN surface layer 11, and the pair of ohmic electrodes, namely, a source electrode 4 and a drain electrode 5 are disposed on the AlGaN electron supply layer 10 on both sides with the gate electrode 3 interposed therebetween.

The first insulating film 6 is disposed to cover the surface of the compound semiconductor layer (in the illustrated case, the GaN surface layer 11) in the compound semiconductor stack structure 2 as well as the surface of the source electrode 4 and the surface of the drain electrode 5. But the configuration is not limited to this as long as the first insulating film 6 covers at least the surface of the compound semiconductor stack structure 2. In the illustrated case, the first insulating film 6 is disposed in contact with the surface of the compound semiconductor stack structure 2.

The first insulating film 6 is a silicon nitride film which includes, on its top side, a first region 6X containing nitrogen element in excess of the stoichiometric ratio. That is, the first insulating film 6 is a silicon nitride film which includes a first region 6X on its top side containing a larger amount of nitrogen element than on the back side, namely, on the compound semiconductor stack structure 2 side. The first region 6X will be also referred to as the high-nitrogen region or the N-rich region. Further, a second region 6Y of the first insulating film 6 other than the first region 6X is stoichiometric. For example, the first insulating film 6 is a stoichiometric silicon nitride film (a stoichiometric SiN film) which includes, on its top side, a nitrogen-implanted region formed by local implantation of nitrogen. In this case, the nitrogen-implanted region is the first region 6X, and the stoichiometric region other than the nitrogen-implanted region is the second region 6Y. The first insulating film 6 may be a single layer or a multilayer structure. Further, the first region 6X of the first insulating film 6 is not limited to a nitrogen-implanted region, and may be any region as long as containing nitrogen element in excess of the stoichiometric ratio.

Here, the stoichiometric second region 6Y in the first insulating film 6 is a stoichiometric silicon nitride region formed of stoichiometrically correct (N/Si=4/3) silicon nitride, and exhibits excellent insulating properties. In the second region 6Y, the refractive index (refractive index to 633 nm wavelength light) of the silicon nitride film is or is close to 2.0. On the other hand, the refractive index (refractive index to 633 nm wavelength light) of the silicon nitride film is or is close to 1.9 in the first region 6X containing nitrogen element in excess of the stoichiometric ratio on the top side of the first insulating film 6.

The first region 6X containing nitrogen element in excess of the stoichiometric ratio is provided on the top side of the first insulating film 6 in order to decrease the number of dangling bonds which act as electron traps on the surface of the first insulating film 6 and thereby to reduce current collapse. On the other hand, the first insulating film 6 except the first region 6X, namely, the second region 6Y is stoichiometric and may therefore ensure properties such as insulating properties, withstand voltage and moisture resistance. That is, covering the surface of the compound semiconductor stack structure 2 with the above first insulating film 6 makes it possible to decrease the number of dangling bonds which act as electron traps on the surface of the first insulating film 6 and thereby to reduce current collapse while ensuring properties such as insulating properties, withstand voltage and moisture resistance.

Thus, the insulating film covering the surface of the compound semiconductor stack structure 2 is suitably a stoichiometric silicon nitride film (a stoichiometric film) from such viewpoints as insulating properties, withstand voltage and moisture resistance. However, a stoichiometric silicon nitride film includes a large number of dangling bonds which act as electron traps because, even though the atomic composition ratio is substantially stoichiometric, incomplete bonds occur at a certain probability during film production. In particular, dangling bonds present on the surface of the insulating film covering the surface of the compound semiconductor stack structure 2 easily capture electrons which have undergone real-space transition, thus causing current collapse.

On the other hand, dangling bonds are few in a silicon nitride film containing nitrogen element in excess of the stoichiometric ratio, namely, in a silicon nitride film having a high nitrogen proportion (nitrogen element proportion) (a N-rich film), probably because the trivalent nitrogen has such a high mobility that it easily forms bonds with atoms such as Si. It is however unknown what bonds are formed by the excess nitrogen atoms. Due to these effects, the number of dangling bonds may be decreased and current collapse may be reduced by the use of a silicon nitride film containing nitrogen element in excess of the stoichiometric ratio. However, a silicon nitride film containing nitrogen element in excess of the stoichiometric ratio is off the stoichiometric ratio and thus has difficulties in ensuring properties such as insulating properties, withstand voltage and moisture resistance.

Figure 2:
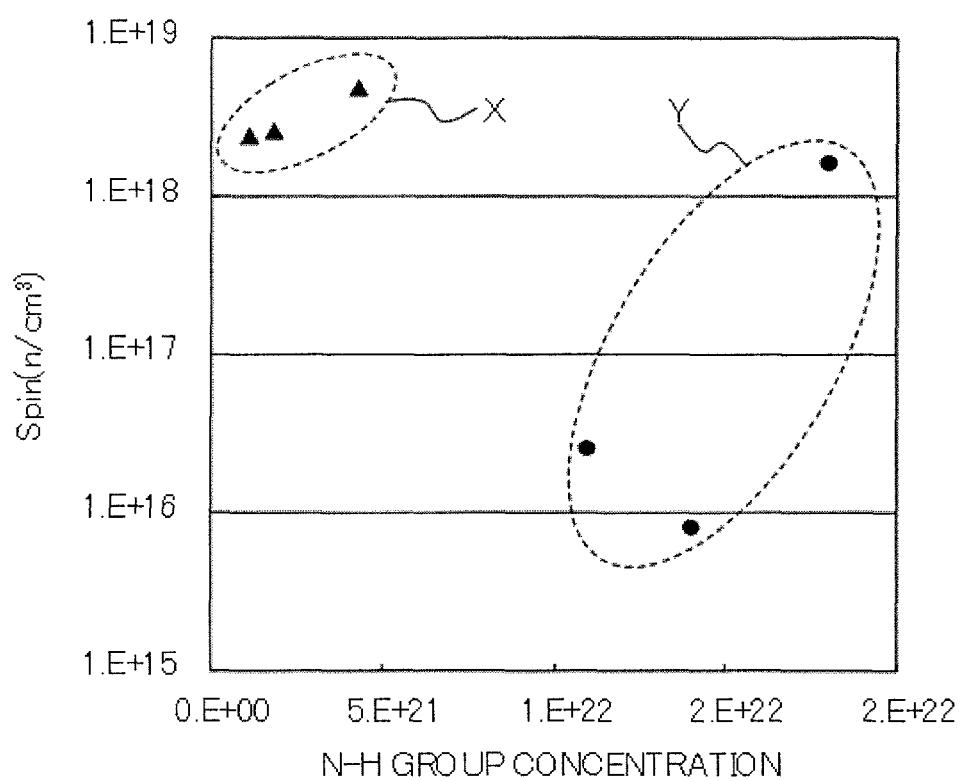
FIG. 2 is a diagram illustrating relationships between the N—H group concentration and the spin concentration in silicon nitride films.

FIG. 2 is a diagram illustrating relationships between the N—H group concentration and the spin concentration in silicon nitride films. In FIG. 2, a relationship between the N—H group concentration and the spin concentration in stoichiometric films is plotted with triangle marks, and a relationship between the N—H group concentration and the spin concentration in N-rich films is plotted with circular marks. In FIG. 2, the letter X indicates a group of data of the stoichiometric films, and the letter Y indicates a group of data of the N-rich films. The number of dangling bonds is increased with increasing spin concentration, and the number of dangling bonds is decreased with decreasing spin concentration.

Under the conditions in the production of silicon nitride films described herein, the films become richer in nitrogen with a higher nitrogen proportion as the N—H group concentration is increased. The refractive index (refractive index to 633 nm wavelength light) of the stoichiometric films is or is close to 2.0, and the refractive index (refractive index to 633 nm wavelength light) of the N-rich films is or is close to 1.9. These refractive indexes are parameters which depend on, for example, the density of the films, and indirectly indicate the atomic composition ratios. The atomic composition ratio, namely, N/Si in the stoichiometric films is 1.33. The atomic composition ratio, namely, N/Si in the N-rich films is 1.40. These values of the atomic composition are obtained by analysis based on a Rutherford backscattering (RBS) method.

As illustrated in FIG. 2, the spin concentration is higher in the stoichiometric films. That is, it has been demonstrated that stoichiometric films have a large number of dangling bonds. On the other hand, the spin concentration in the N-rich films is lower. That is, it has been demonstrated that N-rich films have a small number of dangling bonds. Thus, N-rich films have been demonstrated to have a lower spin concentration than stoichiometric films. In other words, N-rich films have fewer dangling bonds than found in stoichiometric films. It has been further illustrated that among the stoichiometric films, those with a lower N—H group concentration have a lower spin concentration. That is, it has been demonstrated that stoichiometric films having a lower N—H group concentration contain a smaller number of dangling bonds.

Similarly, among the N-rich films, those with a lower N—H group concentration have a lower spin concentration. That is, it has been demonstrated that N-rich films having a lower N—H group concentration contain a smaller number of dangling bonds. With respect to the two groups of films, namely, the group of stoichiometric films and the group of N-rich films, as discussed above, it has been found that silicon nitride films with a lower N—H group concentration, namely, silicon nitride films with fewer H bonds inhibiting the bonding between Si and N have a lower spin concentration and a smaller number of dangling bonds. In order to form a silicon nitride film with a low N—H group concentration, namely, a silicon nitride film with a small number of dangling bonds, it is effective to perform such a technique as nitrogen implantation or $N_2$ plasma exposure. That is, such a silicon nitride film with a low N—H group concentration, namely, such a silicon nitride film with a small number of dangling bonds is more effectively formed by nitrogen implantation or $N_2$ plasma exposure than by, for example, $NH_3$ plasma irradiation.

In the present embodiment, as described above, a stoichiometric silicon nitride film is used as the insulating film covering the surface of the compound semiconductor stack structure 2 and a first region 6X containing nitrogen element in excess of the stoichiometric ratio is provided locally on the top side of the insulating film. According to this configuration, the number of dangling bonds which act as electron traps on the surface of the insulating film is decreased to reduce current collapse while ensuring properties such as withstand voltage, moisture resistance and insulating properties. Here, current collapse is reduced by using a stoichiometric silicon nitride film as the insulating film covering the surface of the compound semiconductor stack structure 2 and by disposing a N-rich region containing few dangling bonds (a N-rich region in which the formation of bonds is not inhibited by hydrogen) on the top side of the insulating film.

In the present embodiment, the first insulating film 6 has a gate opening (a gate electrode formation opening) 6A which extends to the surface of the compound semiconductor stack structure 2 (in the illustrated case, the surface of the GaN surface layer 11). That is, the surface of the compound semiconductor stack structure 2 (the Schottky surface; in the illustrated case, the surface of the GaN surface layer 11) is exposed at the bottom of the gate opening 6A in the first insulating film 6. The gate electrode 3 is an overhang gate electrode disposed so as to overhang the gate opening 6A in the first insulating film 6, and is in Schottky contact with the surface of the compound semiconductor stack structure 2 (in the illustrated case, the surface of the GaN surface layer 11). Further, the gate electrode 3 has a fine gate portion 3A (a first portion) provided in the gate opening 6A, and an over-gate portion 3B (a second portion) provided on the fine gate portion 3A so as to extend toward the source electrode 4 and the drain electrode 5 and to be in contact with the surface of the first insulating film 6.

The first region 6X of the first insulating film 6 is provided in a region on the top side of the first insulating film 6 excluding the region on which the over-gate portion 3B is disposed and a region in the vicinity of that region. That is, the first insulating film 6 is a silicon nitride film which has, on its top side, the first region 6X containing a larger amount of nitrogen element than found in the region in the vicinity of the gate electrode 3 (the electric field concentration region). In the illustrated case, the first region 6X of the first insulating film 6 extends from the vicinity of the gate electrode 3 (in the illustrated case, the end of the over-gate portion 3B on the drain electrode 5 side; drain electrode side over-gate end) to the top of the surface of the drain electrode 5, and on the other side extends from the vicinity of the gate electrode 3 (in the illustrated case, the end of the over-gate portion 3B on the source electrode 4 side; source electrode side over-gate end) to the top of the surface of the source electrode 4 so as to be free from contact with the gate electrode 3.

In the above manner, current collapse may be reduced by providing the first insulating film 6 to cover the surface of the compound semiconductor stack structure 2. Further, the number of electron traps on the surface of the first insulating film 6 may be reduced by configuring the first insulating film 6 to be a silicon nitride film which includes on its top side a first region 6X containing nitrogen element in excess of the stoichiometric ratio.

According to this configuration, it becomes possible to reduce a decrease in drain current due to electrons being captured by traps present on the surface of the first insulating film 6. Consequently, sufficient reduction of current collapse becomes feasible. The occurrence of band modulation may be remedied by configuring the first insulating film 6 to be a silicon nitride film which includes, on the top side of the first insulating film 6, a first region 6X containing nitrogen element in excess of the stoichiometric ratio and thereby decreasing the number of electron traps on the surface of the first insulating film 6. Consequently, it becomes possible to reduce current collapse that is a phenomenon in which current is decreased by the expansion of the depletion layer due to electrons being captured by traps present on the surface of the first insulating film 6.

Next, a method for manufacturing the semiconductor devices according to the present embodiment will be described with reference to FIGS. 3A to 3L.

Figure 3A:
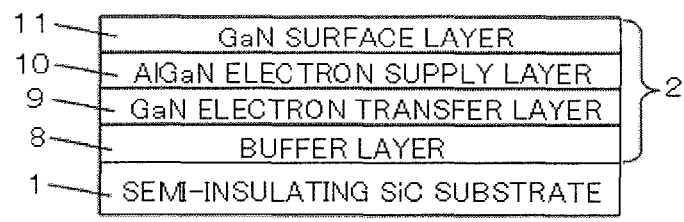
FIG. 3A to FIG. 3L are schematic sectional views illustrating a method for manufacturing semiconductor devices according to the first embodiment.

First, as illustrated in FIG. 3A, a buffer layer 8, a GaN electron transfer layer 9, an AlGaN electron supply layer 10 and a GaN surface layer 11 are sequentially epitaxially grown on a semi-insulating SiC substrate 1 (a semiconductor substrate) by, for example, metal organic vapor phase epitaxy (MOVPE), thereby forming a compound semiconductor stack structure 2 which is a stack of a plurality of compound semiconductor layers 8 to 11. The buffer layer 8 has a role of blocking the propagation of lattice defects on the surface of the SiC substrate 1 to the electron transfer layer 9.

Figure 3B:
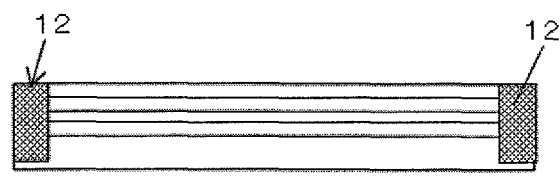

Next, as illustrated in FIG. 3B, the entire stack is divided into elements by selective injection of, for example, Ar into the compound semiconductor stack structure 2 as well as a surface portion of the SiC substrate 1. Consequently, element division regions 12 are formed which define active regions.

Figure 3C:
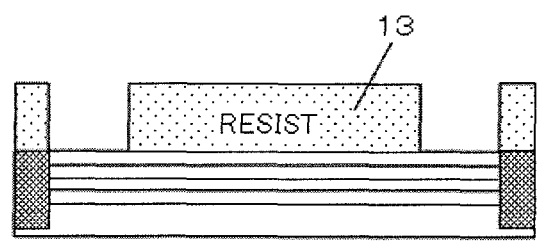

Next, as illustrated in FIG. 3C, a resist pattern 13 is formed on the compound semiconductor stack structure 2 by, for example, photolithography such that the resist pattern 13 has openings in a source electrode formation region and a drain electrode formation region.

Figure 3D:
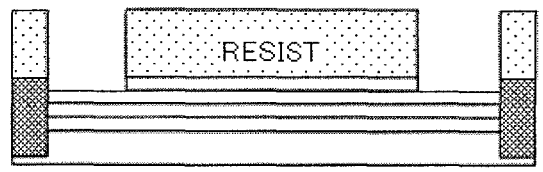

Next, as illustrated in FIG. 3D, the GaN surface layer 11 in the source electrode formation region and the drain electrode formation region is removed by, for example, dry etching with an inert gas and a chlorine-containing gas such as $Cl_2$ gas while using the resist pattern 13 as a mask. Although the GaN surface layer 11 is illustrated as having been removed throughout the thickness, this etching is not limited thereto. For example, the GaN surface layer 11 may be removed to a depth such that part of the GaN surface layer 11 remains. Alternatively, etching may be effected through the GaN surface layer 11 to a depth in the AlGaN electron supply layer 10.

Figure 3E:
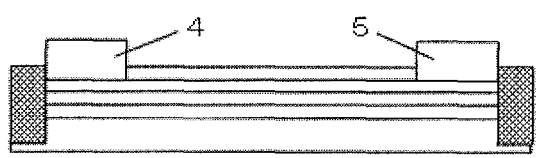

Next, as illustrated in FIG. 3E, a source electrode 4 and a drain electrode 5 are formed in the respective openings created in the source electrode formation scheduled region and the drain electrode formation scheduled region of the GaN surface layer 11. Here, the source electrode 4 and the drain electrode 5 are formed as a pair of ohmic electrodes on the AlGaN electron supply layer 10 by, for example, sequentially depositing Ti (for example, in a thickness of 20 nm) and Al (for example, in a thickness of 200 nm) by a deposition method, and lifting off, namely, removing the resist pattern 13 having the openings. Thereafter, a heat treatment is carried out at a temperature of, for example, about 550° C. to establish an ohmic contact between the AlGaN electron supply layer 10 and the ohmic electrodes, namely, the source electrode 4 and the drain electrode 5.

Next, a first insulating film 6 is formed which is a silicon nitride film that covers the surface of the compound semiconductor stack structure 2 and includes on its top side a first region 6X containing nitrogen element in excess of the stoichiometric ratio.

Figure 3F:
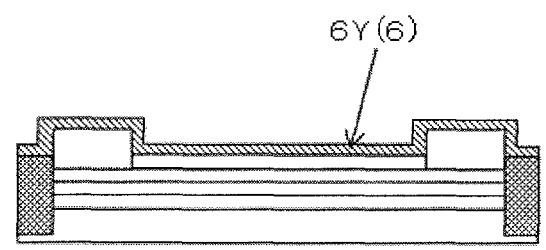

First, as illustrated in FIG. 3F, a silicon nitride film (a SiN film) as the first insulating film 6 is formed so as to cover the entire surface of the compound semiconductor stack structure 2 having the source electrode 4 and the drain electrode 5 as the ohmic electrodes.

In detail, a silicon nitride film as the first insulating film 6 is formed by, for example, plasma chemical vapor deposition (PCVD) on the surface of the compound semiconductor stack structure 2 having the source electrode 4 and the drain electrode 5 as the ohmic electrodes. That is, a silicon nitride film is formed as the first insulating film 6 to cover the surface of the compound semiconductor stack structure 2.

Here, a stoichiometric silicon nitride film having excellent insulating properties is formed as the first insulating film 6. For this purpose, for example, silane and nitrogen as materials are deposited under film production conditions in which the gas flow rates are $SiH_4/N_2$=about 2.5 sccm/about 500 sccm, the pressure is about 1000 mTorr, the film production temperature is about 300° C. and the RF power is about 50 W, thereby forming a silicon nitride film in a thickness of, for example, 50 nm. The refractive index (refractive index to 633 nm wavelength light) of thus-formed silicon nitride films was found to be close to 2.0. The refractive index was measured using ellipsometry. Because the refractive index of the silicon nitride films is or is close to 2.0, the silicon nitride films are substantially stoichiometrically correct, namely, the N/Si ratio is 4/3. That is, objective stoichiometric silicon nitride films having excellent insulating properties were formed.

Figure 3G:
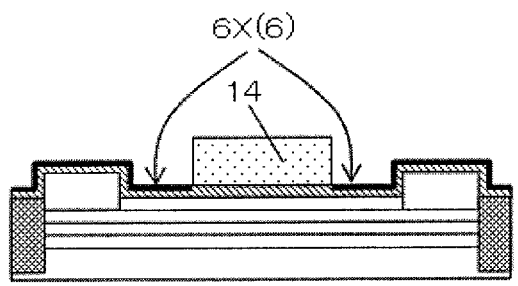

Next, as illustrated in FIG. 3G, a region to be protected from the implantation of nitrogen (nitrogen element) is masked with a resist pattern 14, thereby defining a nitrogen implantation region (a nitrogen introduction region). In the illustrated case, a resist pattern 14 is formed in a region which includes an over-gate portion (of the overhang gate electrode 3) formation scheduled region and which is larger (for example, by about 0.1 μm) than this formation scheduled region. For example, a resist (PFI-32 manufactured by Sumitomo Chemical Co., Ltd.) is applied onto the entire surface; then UV rays are applied to photoexpose a region excluding a region which includes an over-gate portion (of the overhang gate electrode 3) formation scheduled region and which is larger than this formation scheduled region by about 0.1 μm; and the latent pattern is developed with a developing solution (developing solution NMD-W manufactured by TOKYO OHKA KOGYO CO., LTD.) to form a resist pattern 14 in the region which includes an over-gate portion (of the overhang gate electrode 3) formation scheduled region and which is larger than this formation scheduled region by about 0.1 μm.

While using this resist pattern 14 as a mask, nitrogen (nitrogen element) is implanted into the top side of the first insulating film 6 which is a stoichiometric silicon nitride film, thereby forming a first region 6X containing nitrogen element in excess of the stoichiometric ratio. Here, approximately $1 \times 10^{21}$ nitrogen atoms/cm$^3$ to approximately $1 \times 10^{22}$ nitrogen atoms/cm$^3$ are implanted by a nitrogen implantation method selectively in the vicinity of the surface of the first insulating film 6 in the region excluding the region which includes an over-gate portion (of the overhang gate electrode 3) formation scheduled region and which is larger than this formation scheduled region by about 0.1 µm. The nitrogen introduction method is not limited to a nitrogen implantation method, and may be another method such as $N_2$ plasma exposure or $NH_3$ plasma irradiation as long as the method may produce a region containing nitrogen element in excess of the stoichiometric ratio.

After the implantation of nitrogen element, a heat treatment for bond reorganization is performed at a film production temperature higher than about 300° C., for example, at a temperature of about 550° C. The aforementioned heat treatment for establishing ohmic contact may be omitted, and the reorganization of bonds and the establishment of ohmic contact may be accomplished simultaneously by this heat treatment. In the manner described above, the first region 6X containing nitrogen element in excess of the stoichiometric ratio is formed locally on the top side of the first insulating film 6 which is a stoichiometric silicon nitride film. Here, properties such as insulating properties, withstand voltage and moisture resistance are ensured by not providing the first region 6X in the region on the top side of the first insulating film 6 which includes an over-gate portion (of the overhang gate electrode 3) formation scheduled region and which is larger than this formation scheduled region by about 0.1 µm.

That is, because the first region 6X is a N-rich region off the stoichiometric ratio and has difficulties in ensuring properties such as insulating properties, withstand voltage and moisture resistance, the formation of the first region 6X does not occur in the region in the vicinity of the gate electrode 3 where properties such as insulating properties are to be ensured. The refractive index (refractive index to 633 nm wavelength light) of silicon nitride films formed in the first region 6X as described above was found to be close to 1.9. The refractive index was measured using ellipsometry. Because the refractive index of the silicon nitride films in the first region 6X is or is close to 1.9, the silicon nitride films are rich in nitrogen. That is, objective silicon nitride films including a small number of dangling bonds to reduce current collapse were formed.

In the above manner, the first insulating film 6 is formed which is a silicon nitride film covering the surface of the compound semiconductor stack structure 2 and including on its top side the first region 6X containing nitrogen element in excess of the stoichiometric ratio. That is, a stoichiometric silicon nitride film including on its top side the first region 6X containing a small number of dangling bonds is formed as the insulating film that covers the surface of the compound semiconductor stack structure 2.

Figure 3H:
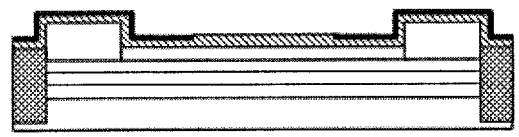
Figure 3I:
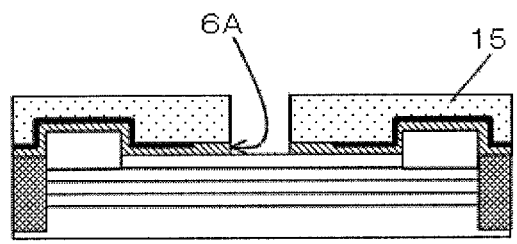

Next, as illustrated in FIG. 3H, the resist pattern 14 is removed with a release liquid. Thereafter, as illustrated in FIG. 3I, a gate opening formation resist pattern 15 is formed. For example, a resist (PFI-32 manufactured by Sumitomo Chemical Co., Ltd.) is applied onto the entire surface; then UV rays are applied to photoexpose a gate opening formation region (for example, about 600 nm in length); and the latent pattern is developed with a developing solution (developing solution NMD-W manufactured by TOKYO OHKA KOGYO CO., LTD.) to form a gate opening formation resist pattern 15 having an opening in the gate opening formation region. The gate opening will be also referred to as the fine gate opening or the Schottky gate electrode formation opening.

While using the gate opening formation resist pattern 15 as a mask, the silicon nitride film as the first insulating film 6 is dry etched with, for example, $SF_6$ as the etching gas to form a gate opening 6A with a length of, for example, about 600 nm (opening width: about 600 nm). Thereafter, the gate opening formation resist pattern 15 is removed with a release liquid.

Figure 3J:
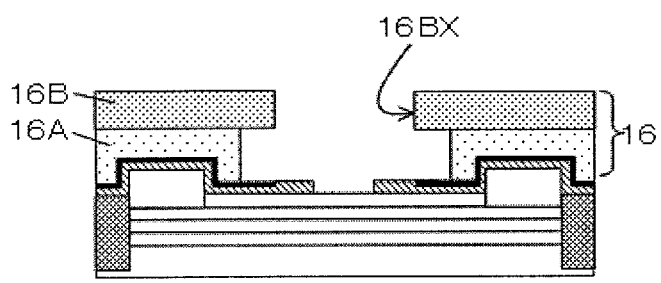

Next, as illustrated in FIG. 3J, a multilayer resist 16 (in the illustrated case, a two-layered resist) is formed which is composed of a lower resist layer 16A (PMGI manufactured by MicroChem Corp. (USA)) and an upper resist layer 16B (PFI32-A8 manufactured by Sumitomo Chemical Co., Ltd.); and the resist is irradiated with radiations such as UV rays and is developed with a developing solution (developing solution NMD-W manufactured by TOKYO OHKA KOGYO CO., LTD.) to form an opening 16BX having a length of, for example, 1.5 µm (opening width: 1.5 µm) in the upper resist layer 16B. The lower resist layer 16A is side-etched during the development of the upper resist layer 16B, and a multilayer resist 16 with a canopy shape is formed.

Figure 3K:
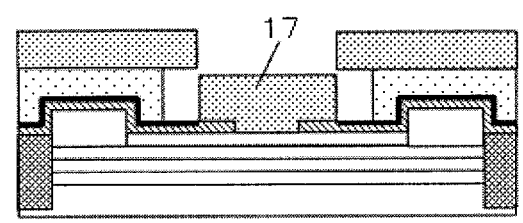

Next, as illustrated in FIG. 3K, gate metals 17 (Ni: in a thickness of, for example, about 10 nm/Au: in a thickness of, for example, about 300 nm) are deposited onto the entire surface while using the canopy-shaped multilayer resist 16 as a mask. For convenience of illustration, the gate metals 17 deposited on the upper resist layer 16B are not illustrated.

Figure 3L:
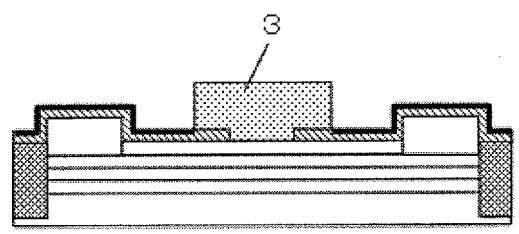

Next, the multilayer resist 16 and the undesired gate metals 17 are removed by lift-off with a hot organic solvent. Thus, as illustrated in FIG. 3L, a gate electrode 3 is formed on the GaN surface layer 11.

Thereafter, although not illustrated, steps are performed to form components such as interlayer insulating films, contact holes and various wires, thus completing the semiconductor devices.

As discussed above, the semiconductor devices and the method for manufacturing the same according to the present embodiment are advantageous in that current collapse may be sufficiently reduced by reducing a decrease in drain current due to electrons being captured by traps present on the surface of the first insulating film 6. That is, semiconductor devices having good current collapse characteristics may be advantageously realized.

When semiconductor devices having the above structure were actually manufactured by the aforementioned manufacturing method, the number of electron traps on the surface of the first insulating film 6 was decreased and the current collapse phenomenon was markedly reduced compared to semiconductor devices which did not have a first region containing nitrogen element in excess of the stoichiometric ratio on the top side of the insulating film.

Figure 4A:
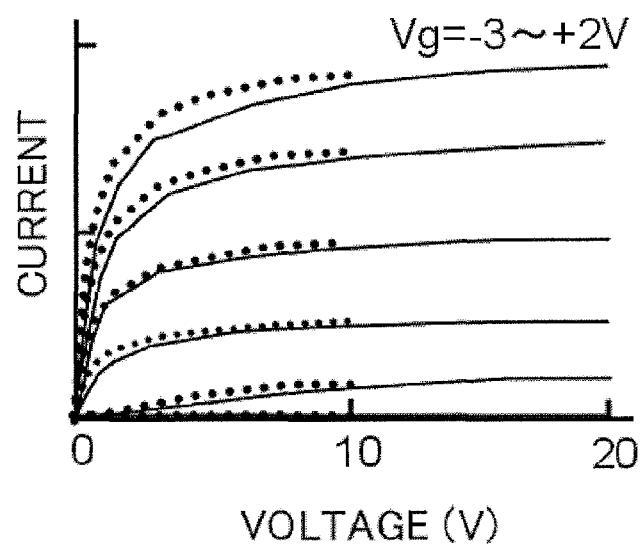
FIG. 4A is a diagram illustrating IV characteristics of a semiconductor device according to the first embodiment.
Figure 4B:
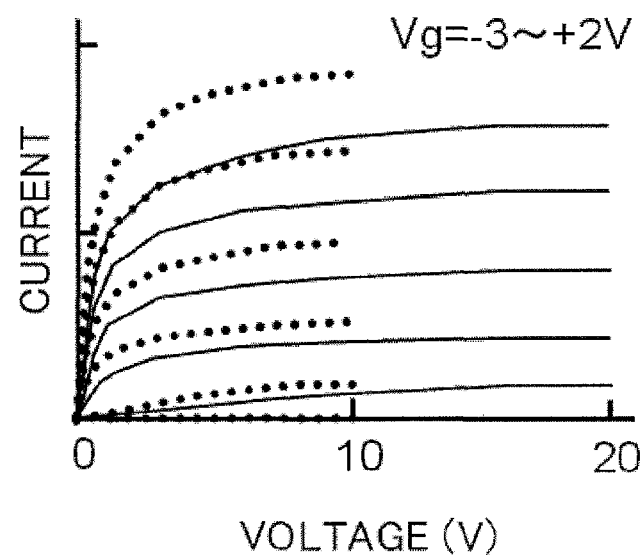
FIG. 4B is a diagram illustrating IV characteristics of a semiconductor device without a first region containing nitrogen element in excess of the stoichiometric ratio on the top side of an insulating film.

That is, the current collapse phenomenon occurred in semiconductor devices which did not have a first region containing nitrogen element in excess of the stoichiometric ratio on the top side of the insulating film, as indicated by pulse IV characteristics illustrated in FIG. 4B. In contrast, the semiconductor devices which included the first region 6X containing nitrogen element in excess of the stoichiometric ratio on the top side of the first insulating film 6 as described above exhibited a marked reduction in the current collapse phenomenon as indicated by pulse IV characteristics illustrated in FIG. 4A. In FIGS. 4A and 4B, the dotted lines indicate current-voltage characteristics (drain current-drain voltage characteristics) during low voltage application, and the actual lines indicate current-voltage characteristics (drain current-drain voltage characteristics) during high voltage application.

Figure 5:
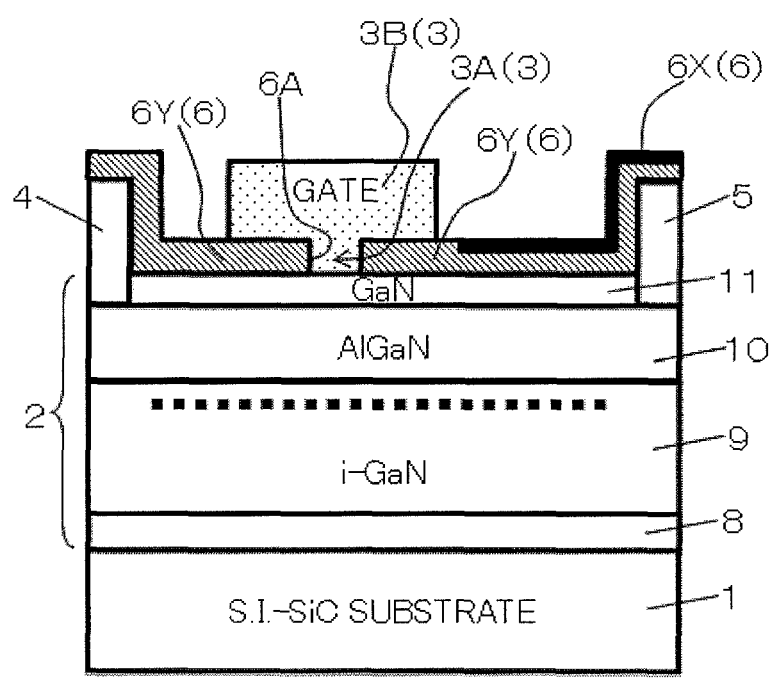
FIG. 5 is a schematic sectional view illustrating a configuration of a semiconductor device according to a first modification of the first embodiment.

While the first region 6X in the above embodiment has been illustrated as being provided on both sides, namely, on the drain electrode 5 side and the source electrode 4 side with respect to the gate electrode 3, the configuration is not limited thereto and may be such that, for example, the first region 6X is provided only on the drain electrode 5 side with respect to the gate electrode 3 as illustrated in FIG. 5. That is, the first region 6X of the first insulating film 6 may be provided to extend only from the vicinity of the gate electrode 3 (in the illustrated case, the drain electrode side over-gate end) to the top of the surface of the drain electrode 5. Such a configuration fulfills the purpose because a strong electric field is applied between the drain electrode side over-gate end and the drain electrode end, and electrons are more likely to become trapped at the surface of the first insulating film 6 on the drain electrode 5 side with respect to the gate electrode 3. This configuration will be referred to as the first modification.

Figure 6:
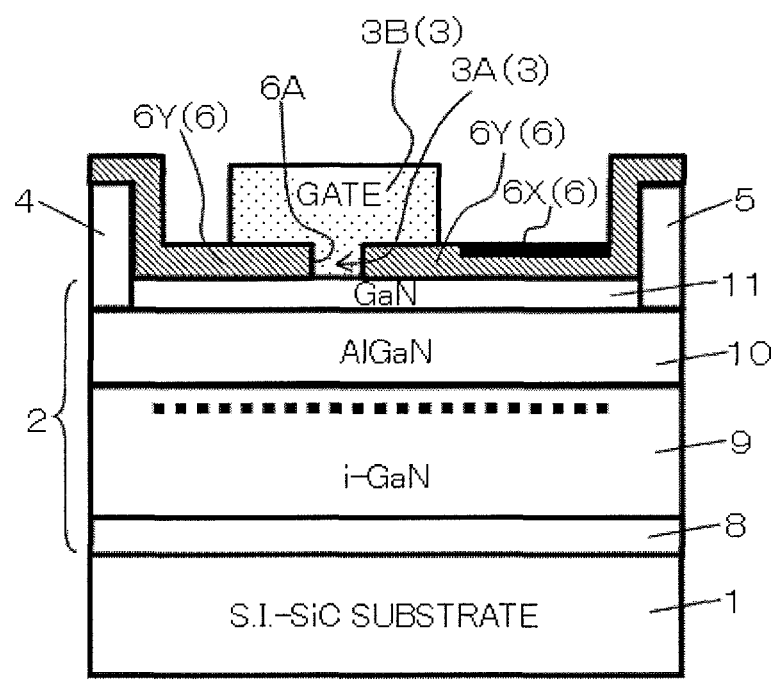
FIG. 6 is a schematic sectional view illustrating a configuration of a semiconductor device according to a second modification of the first embodiment.

Alternatively, for example, the first region 6X of the first insulating film 6 may not extend to the top of the surfaces of the drain electrode 5 and the source electrode 4 to cover the drain electrode 5 and the source electrode 4. For example, the first region 6X of the first insulating film 6 may be provided only between the gate electrode 3 and the drain electrode 5 and between the gate electrode 3 and the source electrode 4. That is, the first region 6X of the first insulating film 6 may be provided to extend from the vicinity of the gate electrode 3 to the vicinities of the drain electrode 5 and the source electrode 4. Still alternatively, for example, the first region 6X of the first insulating film 6 may be provided only between the gate electrode 3 and the drain electrode 5 as illustrated in FIG. 6. That is, the first region 6X of the first insulating film 6 may be provided to extend only from the vicinity of the gate electrode 3 to the vicinity of the drain electrode 5. This configuration will be referred to as the second modification. As in the configurations described above, the first region 6X may be provided only in regions subjected to a high electric field intensity, and other regions subjected to a low electric field intensity may be free of the first region 6X.

Figure 7:
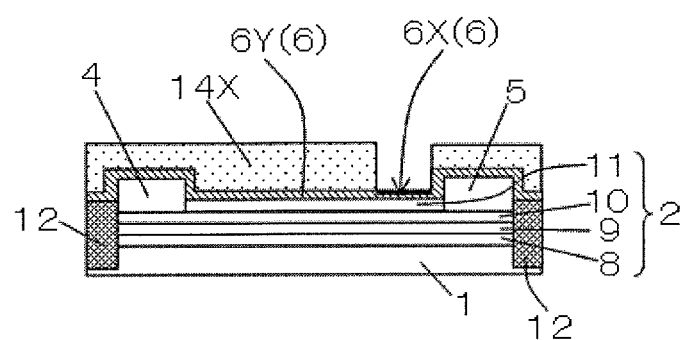
FIG. 7 is a schematic sectional view illustrating a method for manufacturing semiconductor devices according to the second modification of the first embodiment.

That is, because electrons are more likely to become trapped at the surface of the first insulating film 6 in the region subjected to a high electric field intensity, the formation of the first region 6X may take place only in this region to decrease the number of dangling bonds and to reduce current collapse. In this case, the region subjected to a low electric field intensity is a stoichiometric second region 6Y, and thus properties such as insulating properties, withstand voltage and moisture resistance may be ensured more efficiently. That is, properties such as insulating properties, withstand voltage and moisture resistance may be ensured more efficiently because the stoichiometric second region 6Y is larger than in the aforementioned embodiment. In this case, the first region (the nitrogen-implanted region) 6X may be formed by, for example, replacing the step of forming the first region 6X [see FIG. 3G] in the manufacturing method in the aforementioned embodiment by a step in which a resist pattern 14X is formed which has an opening in a region extending from the vicinity of the gate electrode formation region to the vicinity of the drain electrode 5 as illustrated in FIG. 7, and in which nitrogen (nitrogen element) is implanted in the same way as in the aforementioned embodiment while using this resist pattern 14X as a mask.

In the aforementioned embodiment (see FIG. 1), the first modification (see FIG. 5) and the second modification (see FIG. 6), the first region 6X of the first insulating film 6 is provided in a region on the top side of the first insulating film 6 excluding the region on which the over-gate portion 3B is provided and a region in the vicinity of that region so as to avoid any contact with the gate electrode 3. However, the configuration is not limited thereto and may be such that, for example, the first region 6X of the first insulating film 6 is provided in a region on the top side of the first insulating film 6 including a region found under the over-gate portion (the second portion) 3B so as to be in contact with the gate electrode 3.

Figure 8:
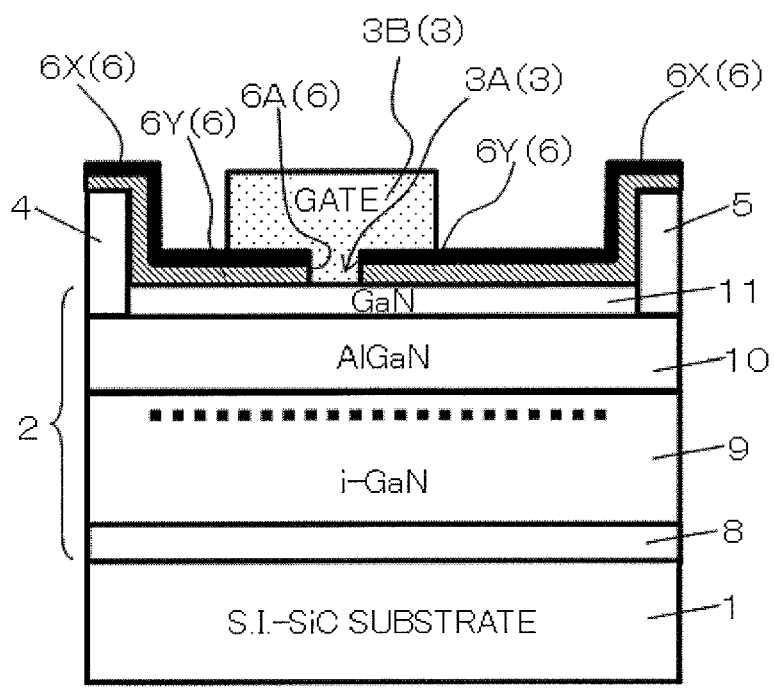
FIG. 8 is a schematic sectional view illustrating a configuration of a semiconductor device according to a third modification of the first embodiment.

For example, this configuration may be applied to each of the aforementioned embodiment (see FIG. 1), the first modification (see FIG. 5) and the second modification (see FIG. 6). That is, as illustrated in, for example, FIGS. 8 to 10, the first region (the nitrogen-rich region) 6X of the first insulating film 6 may be provided to extend under the over-gate portion 3B of the gate electrode 3. That is, as illustrated in FIG. 8 as an example, the first region 6X of the first insulating film 6 may be provided on both sides, namely, on the drain electrode 5 side and the source electrode 4 side with respect to the gate electrode 3 so as to extend from the vicinity of the gate electrode 3 (in the illustrated case, the fine gate portion 3A) to the top of the surface of the drain electrode 5 and the top of the surface of the source electrode 4.

Figure 9:
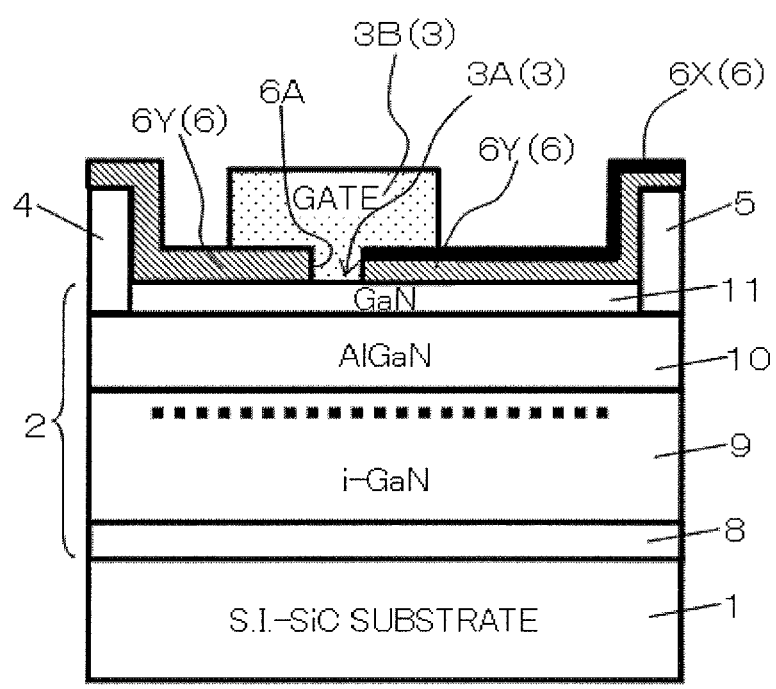
FIG. 9 is a schematic sectional view illustrating a configuration of a semiconductor device according to a fourth modification of the first embodiment.

This configuration will be referred to as the third modification. Further, as illustrated in FIG. 9 as an example, the first region 6X of the first insulating film 6 may be provided only on the drain electrode 5 side with respect to the gate electrode 3 so as to extend from the vicinity of the gate electrode 3 (in the illustrated case, the fine gate portion 3A) to the top of the surface of the drain electrode 5. This configuration will be referred to as the fourth modification.

Figure 10:
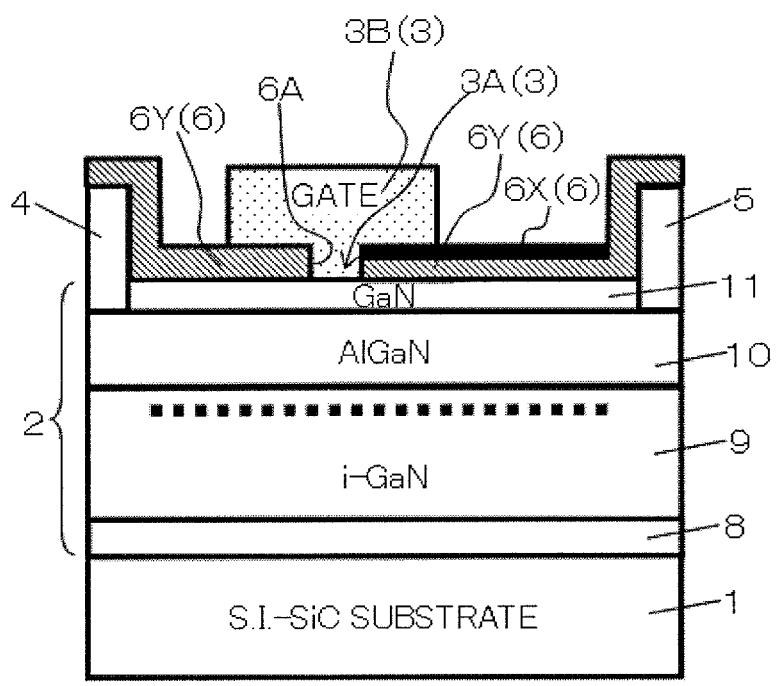
FIG. 10 is a schematic sectional view illustrating a configuration of a semiconductor device according to a fifth modification of the first embodiment.

Furthermore, as illustrated in FIG. 10 as an example, the first region 6X of the first insulating film 6 may be provided between the gate electrode 3 (in the illustrated case, the fine gate portion 3A) and the drain electrode 5 so as to extend from the vicinity of the gate electrode 3 (in the illustrated case, the fine gate portion 3A) to the vicinity of the drain electrode 5. This configuration will be referred to as the fifth modification. As indicated by pulse IV characteristics in FIG. 11, the current collapse was further reduced by allowing the first region 6X of the first insulating film 6 to extend under the over-gate portion 3B of the gate electrode 3 as in the third modification to the fifth modification.

Figure 11:
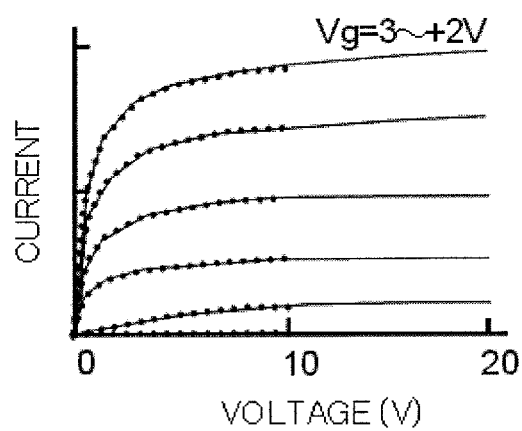
FIG. 11 is a diagram illustrating IV characteristics of semiconductor devices according to the third to fifth modifications of the first embodiment.

In FIG. 11, the dotted lines indicate current-voltage characteristics (drain current-drain voltage characteristics) during low voltage application, and the actual lines indicate current-voltage characteristics (drain current-drain voltage characteristics) during high voltage application. In this case, current collapse characteristics are enhanced at the sacrifice of other properties such as withstand voltage. That is, the extension of the first region 6X of the first insulating film 6 may enhance current collapse characteristics but results in a decrease in properties such as gate-drain withstand voltage because the first insulating film 6 covering the semiconductor surface is rendered nonstoichiometric.

Thus, such a configuration is effective when the desired withstand voltage is not very high. For example, devices in which the voltage supplied to the drain electrode is about 50 V scarcely suffer adverse effects by the extension of the first region 6X, namely, adverse effects caused by the first insulating film 6 being rendered nonstoichiometric, and the further reduction of current collapse outweighs such adverse effects. In this case, the first region 6X may extend to any position between the end of the over-gate portion 3B of the gate electrode 3 (the over-gate end; umbrella end) and the fine gate portion 3A of the gate electrode 3. The range of extension of the first region 6X may be changed and controlled by adjusting the extension in which the resist pattern used in the first region 6X formation step is formed.

Figure 12:
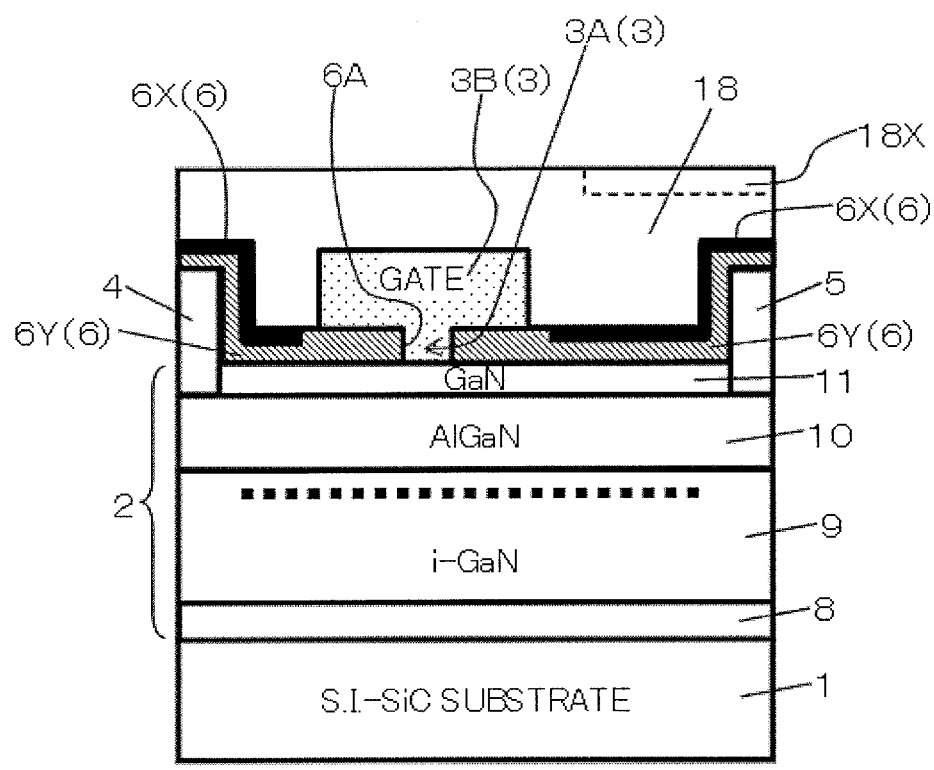
FIG. 12 is a schematic sectional view illustrating a configuration of a semiconductor device according to a sixth modification of the first embodiment.

In the aforementioned embodiment, a second insulating film 18 may be further provided to cover the first insulating film 6, for example, as illustrated in FIG. 12. This configuration will be referred to as the sixth modification. For example, the second insulating film 18 such as a SiN film may be provided to cover the entire surface, namely, the first insulating film 6 including the first region 6X and the gate electrode 3. In this manner, the reliability of properties such as moisture resistance may be improved. In this case, the second insulating film 18 may be a stoichiometric silicon nitride film and, as indicated with a dotted line in FIG. 12, nitrogen (nitrogen element) may be implanted on the top side of the second insulating film 18 to form a region (in the illustrated case, a nitrogen-implanted region) 18X containing nitrogen element in excess of the stoichiometric ratio. That is, the second insulating film 18 may be a silicon nitride film which covers the first insulating film 6 and includes a region containing nitrogen element in excess of the stoichiometric ratio on the top side.

While this configuration has been illustrated as a modification of the aforementioned embodiment, the configuration may be applied also as a modification of the first modification or the second modification. That is, the second insulating film 18 covering the first insulating film 6 may be provided in the semiconductor devices in which the first region 6X is provided only on the drain electrode 5 side with respect to the gate electrode 3 (see FIGS. 5 and 6). Further, the above configuration may be applied as a modification of any of the third modification to the fifth modification. That is, the second insulating film 18 covering the first insulating film 6 may be provided in the semiconductor devices in which the first region 6X of the first insulating film 6 extends under the over-gate portion 3B of the gate electrode 3 (see FIGS. 8 to 10).

In the aforementioned embodiment, a field plate may be provided such that at least part of the field plate is located between the gate electrode 3 and the drain electrode 5. For example, a second insulating film 18 covering the first insulating film 6 may be provided, and a source field plate having the same potential as the source may be provided on the second insulating film 18 such that an end of the source field plate is located above between the gate electrode 3 and the drain electrode 5.

Figure 13:
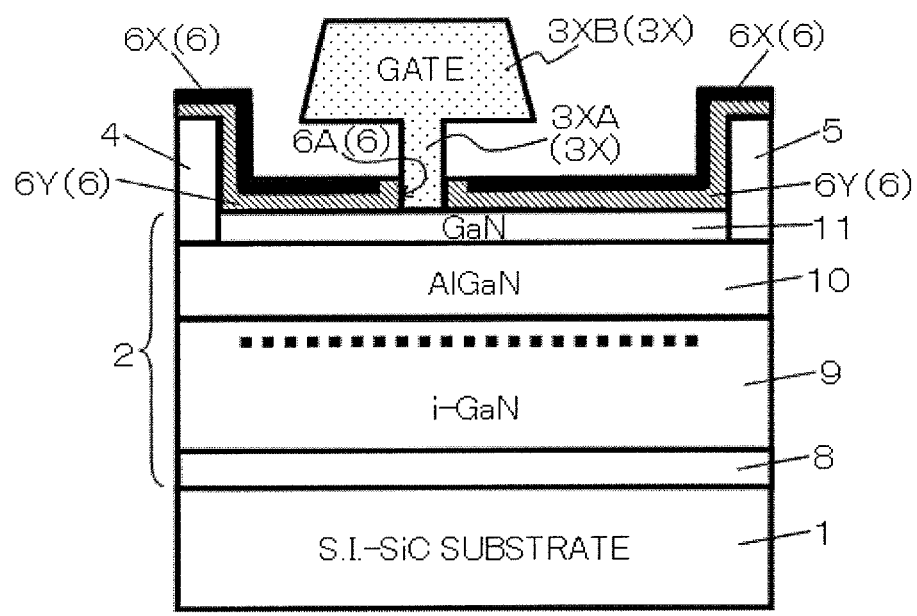
FIG. 13 is a schematic sectional view illustrating a configuration of a semiconductor device according to a seventh modification of the first embodiment.

While the overhang gate electrode 3 is used in the aforementioned embodiment, the gate electrode 3 is not limited thereto and may be a T-shaped gate electrode 3X, for example, as illustrated in FIG. 13. In such a case, semiconductor devices exhibiting excellent properties such as high-frequency characteristics may be realized. Such a configuration will be referred to as the seventh modification. This T-shaped gate electrode 3X has a fine gate portion 3XA (a first portion) provided in the gate opening 6A and extending upward beyond the first insulating film 6, and an over-gate portion 3XB (a second portion) extending over the fine gate portion 3XA toward the source electrode 4 and the drain electrode 5 and provided without contact with the surface of the first insulating film 6.

In this case, the first region 6X of the first insulating film 6 may be appropriately provided in a region on the top side of the first insulating film 6 which includes a region found under the over-gate portion 3XB. That is, the first region 6X of the first insulating film 6 may be appropriately provided so as to extend from the vicinity of the fine gate portion 3XA of the T-shaped gate electrode 3X to the drain electrode 5 side and to the source electrode 4 side. For example, the first region 6X may extend to a position which is approximately 0.05 μm away from the fine gate portion 3XA.

Semiconductor devices having such a T-shaped gate electrode 3X have a space between the over-gate portion 3XB of the T-shaped gate electrode 3X and the first insulating film 6. While this configuration has been illustrated as a modification of the aforementioned embodiment, the configuration may be applied also as a modification of the first modification or the second modification. That is, the T-shaped gate electrode 3X may be used in the semiconductor devices in which the first region 6X is provided only on the drain electrode 5 side with respect to the gate electrode 3 (see FIGS. 5 and 6). Further, the above configuration may be applied as a modification of the sixth modification. That is, the T-shaped gate electrode 3X may be used in the semiconductor devices in which the second insulating film 18 is provided to cover the first insulating film 6 (see FIG. 12).

The structure in the aforementioned embodiment is a Schottky structure in which the gate electrode 3 is in Schottky contact with the surface of the compound semiconductor stack structure 2 (in the illustrated case, the surface of the GaN surface layer 11). However, the structure is not limited thereto and may be, for example, a metal-insulator-semiconductor (MIS) structure in which the entire surface of the compound semiconductor stack structure 2 is covered with an insulating film such as a SiN film, an $Al_2O_3$ film, an AlN film or a $HfO_2$ film, and the gate electrode 3 is provided on the insulating film. While this configuration has been illustrated as a modification of the aforementioned embodiment, the configuration may be applied also as a modification of any of the first modification to the seventh modification. That is, an MIS structure may be adopted in these modifications.

While the semiconductor substrate 1 in the aforementioned embodiment is a SiC substrate as an example, the semiconductor substrate 1 is not limited thereto and may be any of other substrates, for example, semiconductor substrates such as sapphire substrates, Si substrates and GaN substrates. Further, the substrates are not limited to semi-insulating substrates and may be, for example, n-type conductive substrates or p-type conductive substrates.

Further, the layer structures of the source electrode 4, the drain electrode 5 and the gate electrode 3 in the aforementioned embodiment are examples and not restrictive. Other layer structures are also usable. For example, the source electrode 4, the drain electrode 5 and the gate electrode 3 in the aforementioned embodiment may have single-layer structures or multilayer structures. Furthermore, the methods for the formation of the source electrode 4, the drain electrode 5 and the gate electrode 3 in the aforementioned embodiment are only examples, and these layers may be formed by any other methods.

The compound semiconductor stack structure 2 constituting GaN-HEMT in the aforementioned embodiment is not limited to the one described above, and may be any structure as long as the structure includes at least a GaN electron transfer layer and an AlGaN electron supply layer. For example, the surface layer may be a layer composed of another material or may be a multilayer structure. Further, for example, the compound semiconductor stack structure 2 may be free of a surface layer. Furthermore, the electron supply layer is not limited to AlGaN, and may be any electron supply layer including any of AlGaN, InAlN and AlInGaN.

While the compound semiconductor stack structure 2 constituting the semiconductor device in the aforementioned embodiment is composed of GaN compound semiconductor materials, the materials are not limited thereto. For example, the compound semiconductor stack structure 2 may be composed of InP compound semiconductor materials. In this case, for example, the compound semiconductor stack structure 2 may be a structure in which a buffer layer, an InGaAs electron transfer layer, an InAlAs electron supply layer, an InP etching stopper layer and an InGaAs low-resistivity layer are sequentially stacked on a semi-insulating InP substrate. As in this case, the compound semiconductor stack structure 2 is not limited as long as the structure includes at least an electron transfer layer and an electron supply layer. For example, any compound semiconductor stack structures may be used which may constitute field effect transistors such as compound semiconductor field effect transistors.

In the aforementioned embodiment, a gate recess may be provided in the compound semiconductor stack structure 2 and the gate electrode 3 may be provided in this gate recess.

Second Embodiment

Next, power supply devices according to the second embodiment will be described with reference to FIG. 14. The power supply device in the present embodiment includes any of the semiconductor devices (HEMT) according to the first embodiment and the modifications described above.

Figure 14:
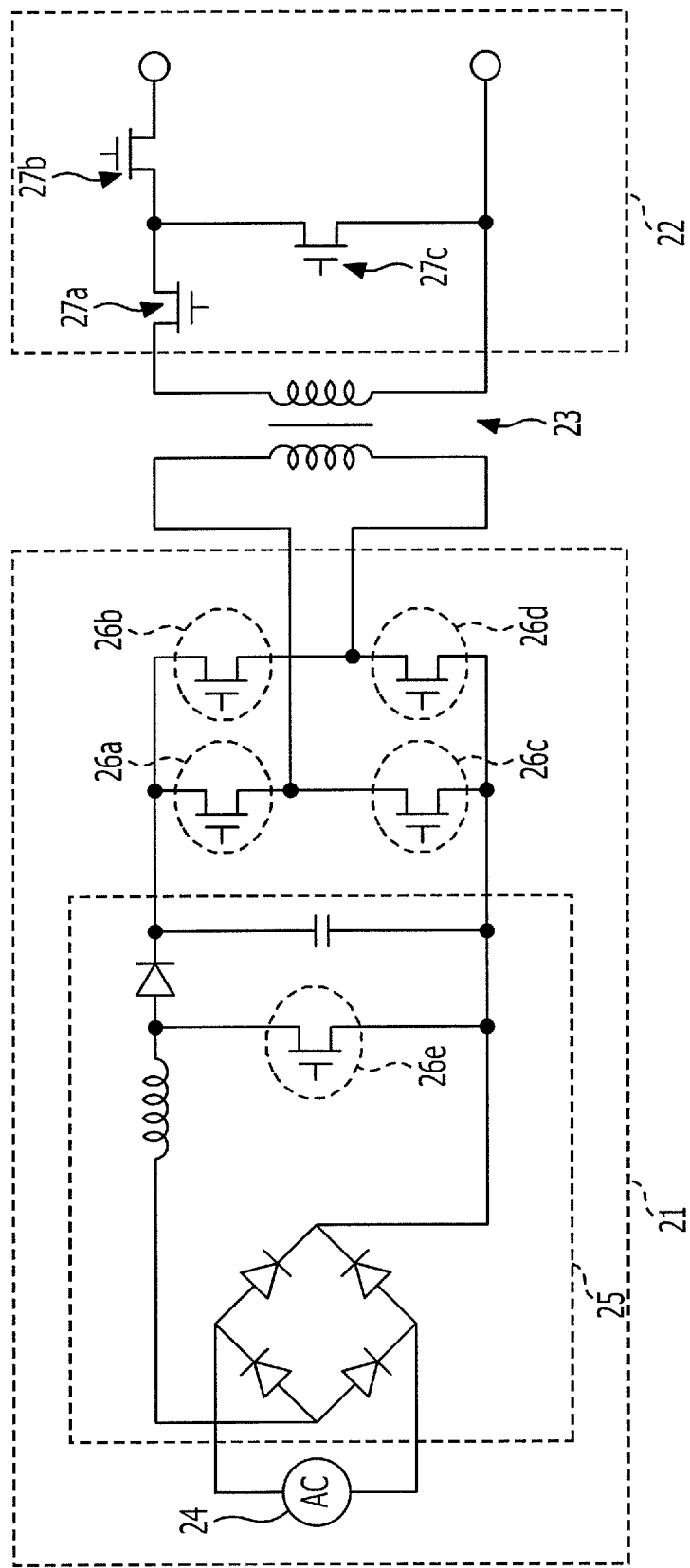
FIG. 14 is a schematic view illustrating a configuration of a power supply device according to a second embodiment.

As illustrated in FIG. 14, the power supply device includes a high-voltage primary circuit (a high-voltage circuit) 21, a low-voltage secondary circuit (a low-voltage circuit) 22, and a transformer 23 disposed between the primary circuit 21 and the secondary circuit 22.

The primary circuit 21 includes an alternating-current power supply 24, a so-called bridge rectifier circuit 25, and a plurality (four in the illustrated case) of switching elements 26a, 26b, 26c and 26d. Further, the bridge rectifier circuit 25 has a switching element 26e. The secondary circuit 22 includes a plurality (three in the illustrated case) of switching elements 27a, 27b and 27c.

In the present embodiment, the switching elements 26a, 26b, 26c, 26d and 26e of the primary circuit 21 are the semiconductor devices (HEMT) according to any of the first embodiment and the modifications described above. On the other hand, the switching elements 27a, 27b and 27c of the secondary circuit 22 are usual MIS-FET having silicon.

In the power supply devices of the present embodiment, the semiconductor devices (HEMT) according to any of the first embodiment and the modifications described above are applied to the high-voltage circuit 21. Thus, the power supply devices advantageously realize high reliability.

Third Embodiment

Next, high-frequency amplifiers according to the third embodiment will be described with reference to FIG. 15. The high-frequency amplifier in the present embodiment includes any of the semiconductor devices (HEMT) according to the first embodiment and the modifications described above.

Figure 15:
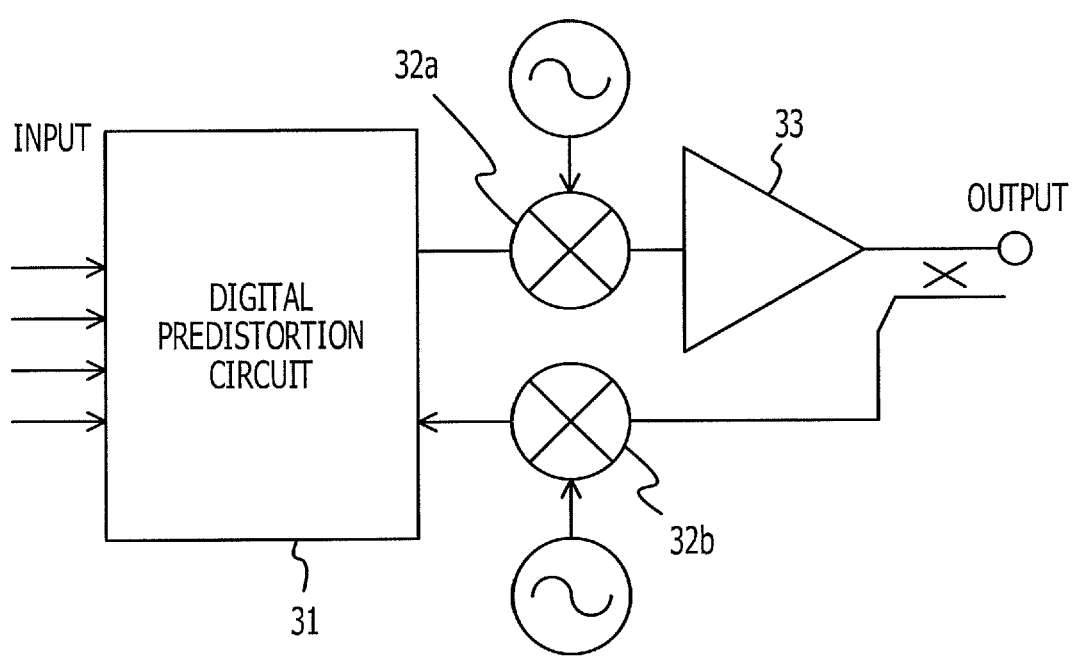
FIG. 15 is a schematic view illustrating a configuration of a high-frequency amplifier according to a third embodiment.

As illustrated in FIG. 15, the high-frequency amplifier includes a digital predistortion circuit 31, mixers 32a and 32b, and a power amplifier 33. The power amplifier may be simply referred to as the amplifier. The digital predistortion circuit 31 compensates for nonlinear distortion of an input signal.

The mixers 32a and 32b perform mixing of an alternating current signal and the input signal whose nonlinear distortion has been compensated for.

The power amplifier 33 amplifies the input signal mixed with the alternating current signal and includes any of the semiconductor devices (HEMT) according to the first embodiment and the modifications described above.

In FIG. 15, the high-frequency amplifier is configured such that a signal on the output side may be mixed with an alternating current signal at the mixer 32b and may be transmitted to the digital predistortion circuit 31 by, for example, switching of the switches.

In the high-frequency amplifiers of the present embodiment, the semiconductor devices (HEMT) according to any of the first embodiment and the modifications described above are applied to the power amplifier 33. Thus, the high-frequency amplifiers advantageously realize high reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing semiconductor devices, comprising:
   forming a compound semiconductor stack structure by stacking a plurality of compound semiconductor layers over a semiconductor substrate; and
   forming a source electrode and a drain electrode over the compound semiconductor stack structure;
   forming a first insulating film to cover the surface of the compound semiconductor stack structure, the source electrode and the drain electrode, the first insulating film being a stoichiometric silicon nitride film;
   forming a first region partially on the first insulating film, the first region containing nitrogen element in excess of the stoichiometric ratio;
   forming an opening in the first insulating film where the first region does not exist, the opening exposes a surface of the compound semiconductor stack structure;
   forming a gate electrode over the compound semiconductor stack structure in the opening and on the first insulating layer, the gate electrode does not couple to the first region.

2. The method for manufacturing semiconductor devices according to claim 1, wherein
   the forming a first insulating film comprises forming a stoichiometric silicon nitride film and implanting nitrogen element on the top side of the silicon nitride film to form the first region.

3. The method for manufacturing semiconductor devices according to claim 1, further comprising:
   forming a second insulating film to cover the first insulating film.

* * * * *